(12) United States Patent
Konishi

(10) Patent No.: US 7,173,298 B2
(45) Date of Patent: Feb. 6, 2007

(54) SOLID-STATE IMAGE PICKUP DEVICE

(75) Inventor: Tomohiro Konishi, Yamatokooriyama (JP)

(73) Assignee: Sharp Kabushiki Kaisha, Osaka (JP)

( * ) Notice: Subject to any disclaimer, the term of this patent is extended or adjusted under 35 U.S.C. 154(b) by 79 days.

(21) Appl. No.: 11/065,758

(22) Filed: Feb. 24, 2005

(65) Prior Publication Data

US 2006/0192203 A1 Aug. 31, 2006

(30) Foreign Application Priority Data

Feb. 25, 2004 (JP) ............................ P2004-049478

(51) Int. Cl.
*H01L 31/062* (2006.01)
*H01L 31/113* (2006.01)
(52) U.S. Cl. ...................... 257/291; 257/290
(58) Field of Classification Search ................ 257/290, 257/291
See application file for complete search history.

(56) References Cited

FOREIGN PATENT DOCUMENTS

JP 2002-076319 3/2002

*Primary Examiner*—Long Pham
(74) *Attorney, Agent, or Firm*—David G. Conlin; Steven M. Jensen; Edwards Angell Palmer & Dodge LLP

(57) ABSTRACT

An imaging area is provided on a surface of a semiconductor substrate, and light-receiving portions and transfer channels are provided in the imaging area. A group of transfer electrodes extends in a direction crossing the transfer channels on the imaging area. A group of transfer signal lines, which are provided for every transfer signal of each phase along the periphery of the imaging area on the semiconductor substrate, is included. A transfer signal line connected to a transfer electrode having a large surface area on the transfer channel, of the group of the transfer electrodes, has an electrical resistance smaller than that of a transfer signal line connected to a transfer electrode having a small surface area on the transfer channel in the group of the transfer electrodes.

10 Claims, 8 Drawing Sheets

SOLID-STATE IMAGE PICKUP DEVICE

This Nonprovisional application claims priority under 35 U.S.C. §119(a) on patent application Ser. No. 2004-049478 filed in Japan on Feb. 25, 2004, the entire contents of which are hereby incorporated by reference.

BACKGROUND OF THE INVENTION

The present invention relates to solid-state imaging devices, and in particular, to a CCD type solid-state imaging device.

As a CCD (Charge Coupled Device) type solid-state imaging device, a two-dimensional image sensor 180 as shown in, for example, FIG. 7 is known (refer to, for example, JP 2002-76319 A). The two-dimensional image sensor 180 has plural vertical CCD's 102 and plural light-receiving portions (photodiodes) 101 arranged at a prescribed pitch PV along the vertical CCD's 102 in a rectangular imaging area 108 set on a semiconductor substrate. The vertical CCD's 102 extend in the vertical direction (vertical direction in FIG. 7) and are arranged at a prescribed pitch PH in the horizontal direction (transverse direction in FIG. 7). One end (lower end in FIG. 7) of each vertical CCD 102 is connected to a horizontal CCD 103 that extends in the horizontal detection. The reference numeral 104 denotes an amplifier. A group 105 of four-phase vertical transfer electrodes 105-1, 105-2, 105-3 and 105-4 constituted of polysilicon doped with an impurity is provided horizontally across the imaging area 108. Although only one group is shown in the figure for simplicity, plural groups identical to the group 105 are actually provided at the same pitch PV as that of the light-receiving portions 101.

Moreover, a group 106 of vertical transfer signal lines 106-1, 106-2, 106-3 and 106-4 is provided along three sides of the periphery of the imaging area 108. Vertical transfer signal input terminals 107-1, 107-2, 107-3 and 107-4, to which four-phase clock pulses φV1, φV2, φV3 and φV4 are inputted, are provided in portions along the upper side of the imaging area of the vertical transfer signal lines 106-1, 106-2, 106-3 and 106-4, respectively. The vertical transfer signal lines 106-1, 106-2, 106-3 and 106-4 connect the vertical transfer signal input terminals, to which the clock pulses φV1, φV2, φV3 and φV4 are inputted, with the end portions (located at the right and left of the imaging area 108) of the vertical transfer electrodes, to which the clock pulses are to be applied, in every phase of the clock pulse. The vertical transfer signal lines 106-1, 106-2, 106-3 and 106-4 are constituted of a mutually identical metal material and set to same width (i.e., W1=W2=W3=W4) and same thickness. It is noted that the lines have a portion (not shown) constituted of polysilicon to form a wiring portion for jumping other wiring lines, a protective resistance or the like.

In operation, the light-receiving portions 101 convert incident light into signal charges. The four-phase clock pulses φV1, φV2, φV3 and φV4 are applied to the vertical transfer signal input terminals 107-1, 107-2, 107-3 and 107-4 by an external circuit (not shown). The clock pulses φV1, φV2, φV3 and φV4 of the phases are transmitted to the end portions of the corresponding vertical transfer electrodes 105-1, 105-2, 105-3 and 105-4 from the corresponding vertical transfer signal input terminals 107-1, 107-2, 107-3 and 107-4, respectively, through the vertical transfer signal lines 106-1, 106-2, 106-3 and 106-4 connected to the input terminals. As a result, the signal charges generated by the light-receiving portions 101 are transferred in the vertical direction toward the horizontal CCD 103 through the vertical CCD's 102 adjacent to the light-receiving portions 101. The transferred signal charges are further transferred in the horizontal direction through the horizontal CCD 103 toward the amplifier 104, amplified by the amplifier 104 and then outputted.

Moreover, in recent years, digital still cameras having a large number of pixels and the like generally have a still mode in which the whole pixel information is read and a monitoring mode in which the information is read while reducing the amount of information by thinning, pixel addition or the like. FIG. 8 shows the construction of a CCD type two-dimensional image sensor 190 that is able to perform such thinning read. In FIG. 8, the same constituents as those of FIG. 7 are denoted by the same reference numerals.

In the two-dimensional image sensor 190, a group 115A of four-phase vertical transfer electrodes 115-1A, 115-2, 115-3 and 115-4, a group 115-1B of four-phase vertical transfer electrodes 115-1B, 115-2, 115-3 and 115-4 and a group 115-1C of four-phase vertical transfer electrodes 115-1C, 115-2, 115-3 and 115-4, which are constituted of polysilicon doped with an impurity, are provided horizontally across the imaging area 108. Although three groups are shown in the figure for simplicity, numbers of groups identical to the three groups 115A, 115B and 115C are actually provided in a repetitive pattern in the vertical direction.

The clock pulse φV1 of the first phase is divided into three clock pulses φV1A, φV1B and φV1C that are mutually independently selected and inputted. In accordance with the above, three vertical transfer signal input terminals 117A-1, 117B-1 and 117C-1 and three vertical transfer signal lines 116A-1, 116B-1 and 116C-1 are provided. The three vertical transfer signal lines 116A-1, 116B-1 and 116C-1 are distributed to plural groups 115A, 115B and 115C of the transfer electrodes arranged in the vertical direction and connected to the transfer electrodes 115-1A, 115-1B and 115-1C, respectively, to which the clock pulses φV1A, φV1B and φV1C of the first phase are to be sequentially applied. The other vertical transfer signal input terminals 117-2, 117-3 and 117-4 and the vertical transfer signal lines 116-2, 116-3 and 116-4 are the same as the vertical transfer signal input terminals 107-2, 107-3 and 107-4 and the vertical transfer signal lines 106-2, 106-3 and 106-4, respectively, in FIG. 7. The vertical transfer signal lines 116A-1, 116B-1, 116C-1, 116-2, 116-3 and 116-4 are constituted of a mutually identical metal material and set to same width (i.e., W1A=W1B=W1C=W2=W3=W4) and same thickness. It is noted that the lines have a portion (not shown) constituted of polysilicon to form a wiring portion for jumping other wiring lines, a protective resistance or the like.

The basic operation of the two-dimensional image sensor 190 is the same as that of the one of FIG. 7. When the signal charges generated by the light-receiving portions 101 are read to the vertical CCD's 102, it is possible to select between a manner such that the inputted clock pulses φV1A, φV1B and φV1C of the first phase do not simultaneously go High level but alternately go High level, a manner such that a certain clock pulse does not go High level and another manner, in order to perform the thinning read. When the signal charges are transferred through the vertical CCD's 102, all the clock pulses φV1A, φV1B and φV1C go High level or Low level at the same timing as φV1 and operate as the four-phase clock pulses φV1, φV2, φV3 and φV4.

Since the clock pulses φV1A, φV1B and φV1C are obtained by dividing the original clock pulse φV1 in order to perform the thinning read, the sum total of the number of the vertical transfer electrodes to which the clock pulses φV1A, φV1B and φV1C are applied and the number of the vertical transfer electrodes to which, for example, another clock pulses φV2 is applied are the same. Moreover, the number of the vertical transfer electrodes to which the clock pulse φV2 is applied, the number of the electrodes to which the clock pulse φV3 is applied and the number of the electrodes to which the clock pulse φV4 is applied are the same.

The load capacity of the transfer electrode (gate) is constituted of (1) a parasitic capacitance between gates, (2) a parasitic capacitance between each gate and a light-shielding film that exists above the gate, (3) a parasitic capacitance between each gate and a substrate that exists below the portion and so on. Since the surface area and the overlap area with other electrodes are varied depending on each transfer electrode, the load capacity possessed by each transfer electrode is also varied.

For example, FIG. 5 shows a plan layout of one group of vertical transfer electrodes 105-1, 105-2, 105-3 and 105-4 in the two-dimensional image sensor 180 shown in FIG. 7. FIG. 6 shows a sectional view taken along the line A–A' in FIG. 5. The reference numeral 100 denotes a surface of the semiconductor substrate, and the numeral 109 denotes the light-shielding film. As is apparent from FIGS. 5 and 6, the surface area and the overlap area with other electrodes of the vertical transfer electrode 105-1 to which the clock pulse φV1 of the first phase is applied are larger than those of the vertical transfer electrodes 105-2, 105-3 and 105-4 of the other phases. In accordance with the above, the load capacity of the vertical transfer electrode 105-1 is larger than the load capacity of each of the other vertical transfer electrodes 105-2, 105-3 and 105-4. As a result, the time constant of the signal propagation system (including the vertical transfer signal input terminal to the vertical transfer electrode) of the clock pulse φV1 of the first phase is greater than the time constant of each of the signal propagation systems of the clock pulses φV2, φV3 and φV4 of the other phases.

Therefore, even if the clock pulses φV1, φV2, φV3 and φV4 are inputted in roughly rectangular waveforms to the vertical transfer signal input terminals 107-1, 107-2, 107-3 and 107-4, respectively, as shown in FIG. 9A, the waveform blunting of the clock pulse φV1 of the first phase becomes larger than the waveform blunting of the clock pulses φV2, φV3 and φV4 of the other phases in a center portion of the imaging area 108 as shown in FIG. 9B. In concrete, at a timing τ1 in FIG. 9B, the clock pulse φV4 starts to rise before the clock pulse φV1 sufficiently falls. Then, as shown in FIG. 10A, the potential barriers ψW1 and ψ4 that the vertical transfer electrodes 105-1 and 105-4 make in the vertical CCD's 102 become lower than the potential barriers ψ2 and ψ3 that the remaining vertical transfer electrodes 105-2 and 105-3 shown in FIG. 10B make. This consequently leads to a problem that the handling amount of charge of the vertical CCD's 102 is reduced due to the low potential barriers ψ1 and ψ4.

On the other hand, in the two-dimensional image sensor 190 of the type that is able to perform the thinning read shown in FIG. 8, the number of the vertical transfer electrodes to which the individual clock pulses of the first phase (e.g., φV1A) are applied is extremely smaller than the number of, for example, the vertical transfer electrodes to which the clock pulses φV2, φV3 and φV4 of the other phases are applied. As a result, the time constant of the signal propagation system of the individual clock pulses of the first phase (e.g., φV1A) is smaller than the time constant of each of the signal propagation systems of the clock pulses φV2, φV3 and φV4 of the other phases. Therefore, the problem of the reduction in the handling amount of charge caused by the signal propagation systems of the clock pulses φV1A, φV1B and φV1C of the first phase does not occur. However, since the clock pulse of the first phase is divided multiple in the two-dimensional image sensor 190, the number of the vertical transfer signal lines 116A-1, 116B-1 and 116C-1 is increased according to it. This therefore leads to a problem that the ratio of the area occupied by the vertical transfer signal lines relative to the area of the imaging area 118 is increased and the chip area is increased. The increase in the chip area, which directly leads to an increase in the chip cost, is therefore a serious problem.

SUMMARY OF THE INVENTION

An object of the present invention is to provide a solid-state imaging device capable of securing a sufficiently large handling amount of charge while avoiding an increase in the chip area.

In order to solve the above problem, the solid-state imaging device of the present invention comprises:

a light-receiving portion, which is provided in an imaging area set on a surface of a semiconductor substrate and converts incident light into a signal charge;

at least one transfer channel extending in one direction in the imaging area;

a group of transfer electrodes, which extend in a direction crossing the transfer channels on the imaging area and to which transfer signals of plural phases are applied so as to transfer the signal charge through the transfer channel; and a group of transfer signal lines, which are provided along a periphery of the imaging area on the semiconductor substrate and connect an input terminal to which a transfer signal is inputted with an end portion of the transfer electrode to which the transfer signal is to be applied, in every transfer signal of each phase, wherein a transfer signal line connected to a transfer electrode having a large surface area on the transfer channel in the group of the transfer electrodes, of the transfer signal lines that constitute the group, has an electrical resistance smaller than that of a transfer signal line connected to a transfer electrode having a small surface area on the transfer channel in the group of the transfer electrodes.

In this case, the "surface area" on the transfer channel of the transfer electrode means the area when viewed from a direction perpendicular to the semiconductor substrate. There is a tendency that the load capacity is increased and the time constant is increased as the "surface area" on the transfer channel of the transfer electrode is increased.

The solid-state imaging device of the present invention has a group of the transfer signal lines, which connect the input terminal to which the transfer signal is inputted with the end portion of the transfer electrode to which the transfer signal is to be applied, in every transfer signal of each phase, like as the solid-state imaging device in the prior art. The transfer signal of each phase is transmitted from the input terminal to which the transfer signal is inputted to the end portion of the corresponding transfer electrode through the transfer signal line connected to the input terminal. As the result of applying transfer signals of different phases to the transfer electrodes that constitute the group, the signal charges generated by the light-receiving portions are transferred through the transfer channel.

In this case, the transfer signal line connected to the transfer electrode having a large surface area on the transfer channel in the group of the transfer electrodes, of the transfer signal lines that constitute the group, has an electrical resistance smaller than that of the transfer signal line connected to the transfer electrode having a small surface area on the transfer channel in the group of the transfer electrodes. Therefore, the waveform blunting of the transfer signal relevant to the transfer electrode having a large surface area on the transfer channel is reduced. As a result, a reduction in the handling amount of charge caused by the waveform blunting of the transfer signal applied to the transfer electrode is suppressed, and a sufficiently large handling amount of charge is secured.

In the solid-state imaging device of one embodiment, the number of the transfer electrodes that constitute the group is three or more, and a magnitude order of electrical resistances of the transfer signal lines that constitute the group is reverse to a size order of the surface areas on the transfer channel of the transfer electrodes to which the transfer signal lines are connected.

The number of the transfer electrodes that constitute the group might be three or more, and their surface area sizes on the transfer channel might be mutually varied. In the above case, as in the solid-state imaging device of the present one embodiment, the magnitude order of the electrical resistances of the transfer signal lines that constitute the group should preferably be reverse to the size order of the surface areas on the transfer channel of the transfer electrodes to which the transfer signal lines are connected. As a result, the reduction in the handling amount of charge caused by the waveform blunting of the transfer signals applied to the transfer electrodes is suppressed more effectively, and a sufficiently large handling amount of charge is secured.

In the solid-state imaging device of one embodiment, the transfer signal line connected to the transfer electrode having a large surface area on the transfer channel, of the transfer signal lines that constitute the group, has a width set wider than that of the transfer signal line connected to the transfer electrode having a small surface area on the transfer channel.

In the solid-state imaging device of the present one embodiment, the transfer signal line connected to the transfer electrode having a large surface area on the transfer channel, of the transfer signal lines that constitute the group, has a width set wider than that of the transfer signal line connected to the transfer electrode having a small surface area on the transfer channel. Therefore, the transfer signal line connected to the transfer electrode having a large surface area on the transfer channel has the electrical resistance smaller than that of the transfer signal line connected to the transfer electrode having a small surface area on the transfer channel. Moreover, the change in the width of the transfer signal line is easily achieved by changing a mask pattern for forming, for example, the transfer signal lines in the manufacturing stage of the solid-state imaging device.

Only the transfer signal line connected to the transfer electrode having a large surface area on the transfer channel has the expanded width, and therefore, the chip area scarcely increases. Moreover, it is acceptable to set the width of the transfer signal line connected to the transfer electrode having a small surface area on the transfer channel narrower than in the conventional case so long as a sufficiently large handling amount of charge is secured. With the above arrangement, the occupation area of the transfer signal lines on the semiconductor substrate can be reduced, and the chip area can be reduced.

In the solid-state imaging device of one embodiment, the transfer signal line connected to the transfer electrode having a large surface area on the transfer channel, of the transfer signal lines that constitute the group, has a sheet resistance set smaller than that of the transfer signal line connected to the transfer electrode having a small surface area on the transfer channel.

In the solid-state imaging device of the present one embodiment, the transfer signal line connected to the transfer electrode having a large surface area on the transfer channel, of the transfer signal lines that constitute the group, has a sheet resistance set smaller than that of the transfer signal line connected to the transfer electrode having a small surface area on the transfer channel. Therefore, the transfer signal line connected to the transfer electrode having a large surface area on the transfer channel has the electrical resistance smaller than that of the transfer signal line connected to the transfer electrode having a small surface area on the transfer channel. Moreover, the change in the sheet resistance of the transfer signal line is easily achieved by changing the material for forming, for example, the vertical transfer signal lines in the manufacturing stage of the solid-state imaging device. Moreover, the chip area is not increased.

In the solid-state imaging device of one embodiment, the transfer signal line connected to the transfer electrode having a large surface area on the transfer channel, of the transfer signal lines that constitute the group, has a thickness set thicker than that of the transfer signal line connected to the transfer electrode having a small surface area on the transfer channel.

In the solid-state imaging device of the present one embodiment, the transfer signal line connected to the transfer electrode having a large surface area on the transfer channel, of the transfer signal lines that constitute the group, has a thickness set thicker than that of the transfer signal line connected to the transfer electrode having a small surface area on the transfer channel. Therefore, the transfer signal line connected to the transfer electrode having a large surface area on the transfer channel has the electrical resistance smaller than that of the transfer signal line connected to the transfer electrode having a small surface area on the transfer channel. Moreover, the change in the thickness of the transfer signal line is easily achieved by changing a deposition time for forming, for example, the transfer signal line in the manufacturing stage of the solid-state imaging device. Moreover, the chip area is not increased.

In the solid-state imaging device of one embodiment, a transfer signal line connected to a transfer electrode having a large load capacity in the group of the transfer electrodes, of the transfer signal lines that constitute the group, has an electrical resistance smaller than that of a transfer signal line connected to a transfer electrode having a small load capacity in the group of the transfer electrodes.

In this case, the "load capacity" of the transfer electrode means an electrostatic capacity generated between the transfer electrode and the semiconductor substrate, between the transfer electrode and another transfer electrode and between the transfer electrode and a light-shielding film provided on the transfer electrode.

In the solid-state imaging device of the present one embodiment, the transfer signal line connected to the transfer electrode having a large load capacity in the group of the transfer electrodes, of the transfer signal lines that constitute the group, has an electrical resistance smaller than that of the transfer signal line connected to the transfer electrode having a small load capacity in the group of the transfer electrodes. Therefore, the waveform blunting of the transfer signal relevant to the transfer electrode having a large load capacity is reduced. As a result, the reduction in the handling amount of charge caused by the waveform blunting of the transfer signal applied to the transfer electrode is suppressed, and a sufficiently large handling amount of charge is secured.

It is noted that such a way for setting the magnitude of the electrical resistance of the transfer signal line connected to the transfer electrode according to the magnitude of the load capacity of the transfer electrode may be replaced by a way for setting the magnitude of the electrical resistance of the transfer signal line connected to the transfer electrode according to the size of the surface area on the transfer channel of the transfer electrode.

In the solid-state imaging device of one embodiment, a transfer signal line connected to a transfer electrode having a large time constant in the group of the transfer electrodes, of the transfer signal lines that constitute the group, has an electrical resistance smaller than that of a transfer signal line connected to a transfer electrode having a small time constant in the group of the transfer electrodes.

In this case, the "time constant" of the transfer electrode is determined by the product of the electrical resistance possessed by the transfer electrode and the load capacity of the transfer electrode.

In the solid-state imaging device of the present one embodiment, the transfer signal line connected to the transfer electrode having a large time constant in the group of the transfer electrodes, of the transfer signal lines that constitute the group, has the electrical resistance smaller than that of the transfer signal line connected to the transfer electrode having a small time constant in the group of the transfer electrodes. Therefore, the waveform blunting of the transfer signal relevant to the transfer electrode having a large time constant is reduced. As a result, the reduction in the handling amount of charge caused by the waveform blunting of the transfer signal applied to the transfer electrode is suppressed, and a sufficiently large handling amount of charge is secured.

It is noted that such a way for setting the magnitude of the electrical resistance of the transfer signal line connected to the transfer electrode according to the magnitude of the time constant of the transfer electrode may be replaced by a way for setting the magnitude of the electrical resistance of the transfer signal line connected to the transfer electrode according to the size of the surface area on the transfer channel of the transfer electrode.

In the solid-state imaging device of one embodiment, a transfer signal of a specified phase of the transfer signals of the plural phases is divided into plural sub-transfer signals that are mutually independently selected and inputted, an input terminal and a transfer signal line, which transmit the transfer signal of the specified phase, are respectively divided into sub-input terminals and sub-transfer signal lines of a number identical to a number of the sub-transfer signals, the plural sub-transfer signal lines, which transmit the transfer signal of the specified phase, are distributed to plural groups of transfer electrodes arranged in the one direction and connected to corresponding transfer electrodes of each group, and the sub-transfer signal line, which transmits the transfer signal of the specified phase, has a width set narrower than that of the transfer signal line that transmits a transfer signal of another phase.

In the solid-state imaging device of the present one embodiment, the sub-transfer signal line, which transmits the transfer signal of the specified phase, has a number of connected transfer electrodes, the number being smaller than that of the transfer signal line that transmits the transfer signal of another phase. Even if the width of the sub-transfer signal line, which transmits the transfer signal of the specified phase, is set narrow in correspondence with the above arrangement, a sufficiently large handling amount of charge can be secured. Accordingly, in the solid-state imaging device of the present one embodiment, the sub-transfer signal line, which transmits the transfer signal of the specified phase, has a width set narrower than that of the transfer signal line that transmits the transfer signal of another phase. Therefore, the occupation area of the transfer signal lines (including the sub-transfer signal lines) on the semiconductor substrate can be reduced while securing a sufficiently large handling amount of charge according to the present invention. As a result, the chip area can be reduced.

In another aspect, the solid-state imaging device of the present invention comprises:

a light-receiving portion, which is provided in an imaging area set on a surface of a semiconductor substrate and converts incident light into a signal charge;

at least one transfer channel extending in one direction in the imaging area;

a group of transfer electrodes, which extend in a direction crossing the transfer channels on the imaging area and to which transfer signals of plural phases are applied so as to transfer the signal charge through the transfer channel; and a group of transfer signal lines, which are provided along a periphery of the imaging area on the semiconductor substrate and connect an input terminal to which a transfer signal is inputted with an end portion of the transfer electrode to which the transfer signal is to be applied, in every transfer signal of each phase, wherein a transfer signal line connected to a transfer electrode having a large load capacity in the group of the transfer electrodes, of the transfer signal lines that constitute the group, has an electrical resistance smaller than that of a transfer signal line connected to a transfer electrode having a small load capacity in the group of the transfer electrodes.

In the solid-state imaging device of the present invention, the transfer signal line connected to the transfer electrode having a large load capacity in the group of the transfer electrodes, of the transfer signal lines that constitute the group, has the electrical resistance smaller than that of the transfer signal line connected to the transfer electrode having a small load capacity in the group of the transfer electrodes. Therefore, the waveform blunting of the transfer signal relevant to the transfer electrode having a large load capacity is reduced. As a result, the reduction in the handling amount of charge caused by the waveform blunting of the transfer signal applied to the transfer electrode is suppressed, and a sufficiently large handling amount of charge is secured.

In yet another aspect, the solid-state imaging device of the present invention comprises:

a light-receiving portion, which is provided in an imaging area set on a surface of a semiconductor substrate and converts incident light into a signal charge;

at least one transfer channel extending in one direction in the imaging area;

a group of transfer electrodes, which extend in a direction crossing the transfer channels on the imaging area and to which transfer signals of plural phases are applied so as to transfer the signal charge through the transfer channel; and a group of transfer signal lines, which are provided along a periphery of the imaging area on the semiconductor substrate and connect an input terminal to which a transfer signal is inputted with an end portion of the transfer electrode to which the transfer signal is to be applied, in every transfer signal of each phase, wherein a transfer signal line connected to a transfer electrode having a large time constant in the group of the transfer electrodes, of the transfer signal lines that constitute the group, has an electrical resistance smaller than that of a transfer signal line connected to a transfer electrode having a small time constant in the group of the transfer electrodes.

In the solid-state imaging device of the present invention, the transfer signal line connected to the transfer electrode having a large time constant in the group of the transfer electrodes, of the transfer signal lines that constitute the group, has the electrical resistance smaller than that of the transfer signal line connected to the transfer electrode having a small time constant in the group of the transfer electrodes. Therefore, the waveform blunting of the transfer signal relevant to the transfer electrode having a large the time constant is reduced. As a result, the reduction in the handling amount of charge caused by the waveform blunting of the transfer signal applied to the transfer electrode is suppressed, and a sufficiently large handling amount of charge is secured.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE INVENTION

Figure 1:
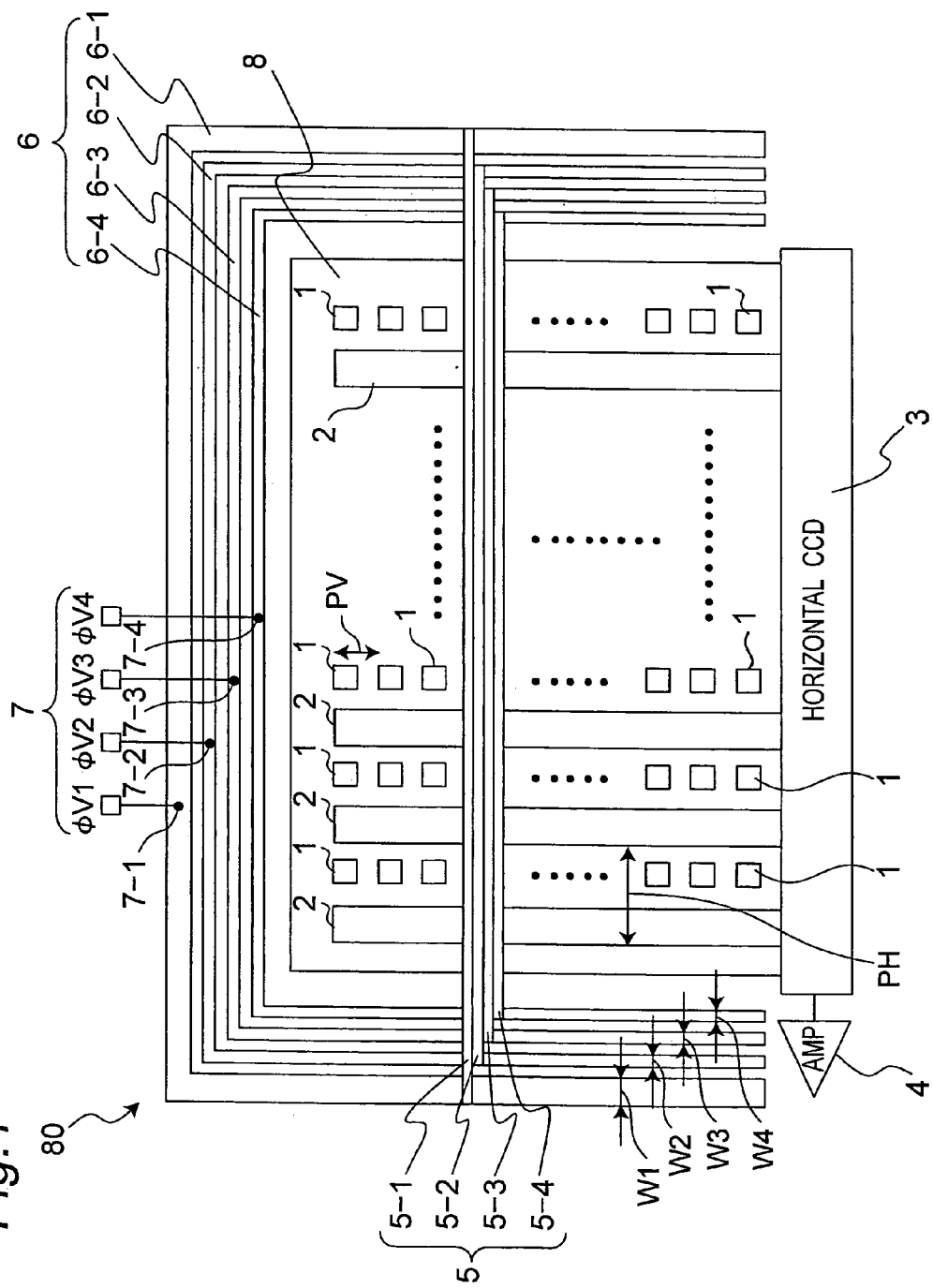
FIG. 1 is a plan view showing the schematic construction of a two-dimensional image sensor according to a first embodiment of the present invention.

The solid-state imaging device of the present invention will be described in detail below on the basis of the embodiments shown in the drawings.

(First Embodiment)

FIG. 1 shows a plan layout of a two-dimensional image sensor 80 according to one embodiment of the CCD (Charge Coupled Device) type solid-state imaging device.

The two-dimensional image sensor 80 has plural vertical CCD's 2 as transfer channels and plural light-receiving portions (photodiodes) 1 arranged at a prescribed pitch PV along the vertical CCD's 2 in a rectangular imaging area 8 set on a semiconductor substrate. The vertical CCD's 2 extend in the vertical direction (vertical direction in FIG. 1) and are arranged at a prescribed pitch PH in the horizontal direction (transverse direction in FIG. 1). One end (lower end in FIG. 1) of each vertical CCD 2 is connected to a horizontal CCD 3 that extends in the horizontal direction. The reference numeral 4 denotes an amplifier. A group 5 of four-phase vertical transfer electrodes 5-1, 5-2, 5-3 and 5-4 constituted of polysilicon doped with an n-type impurity are provided horizontally across the imaging area 8. Although only one group is shown in the figure for simplicity, plural groups identical to the group 5 are actually provided at the same pitch PV as that of the light-receiving portions 1.

Figure 5:
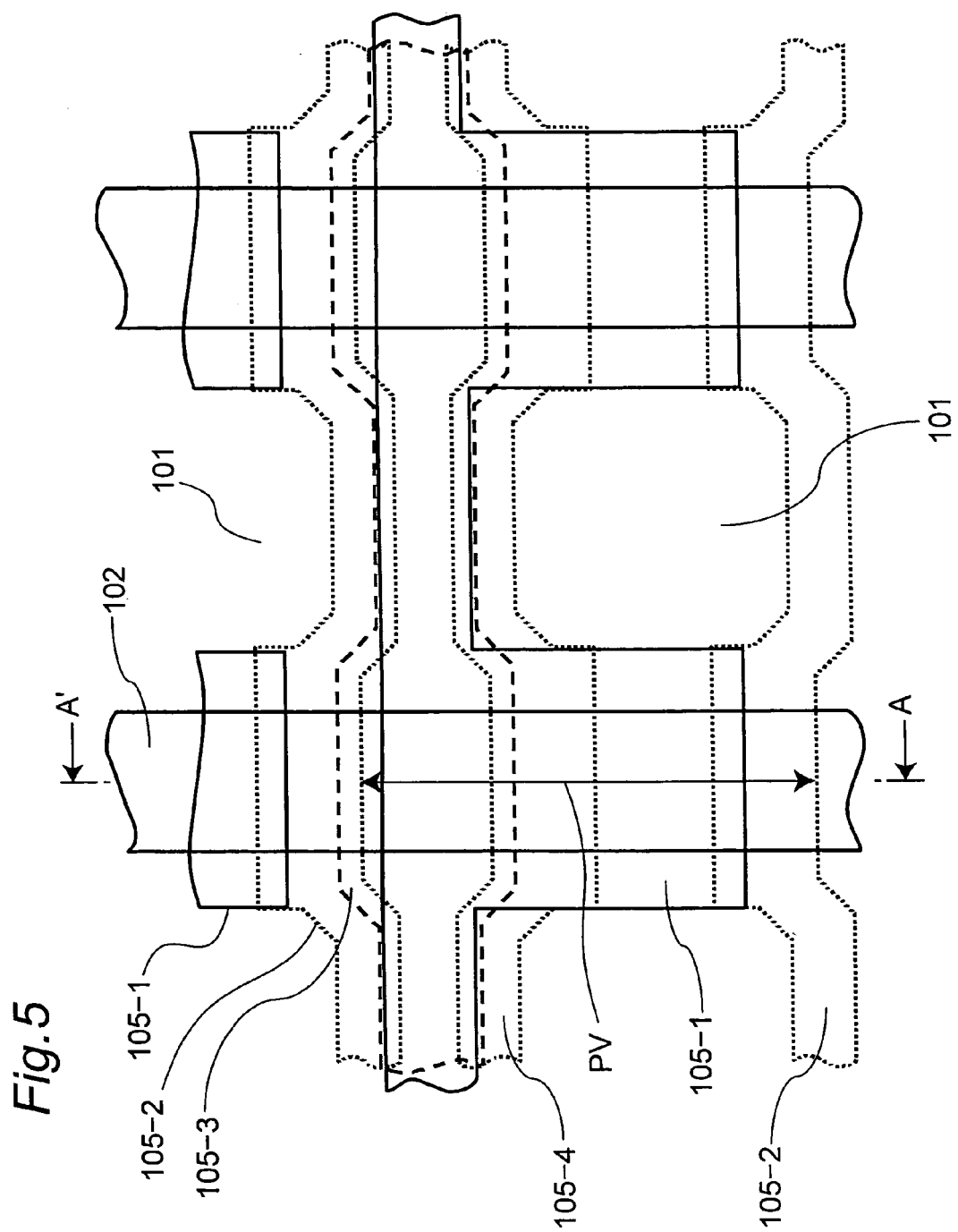
FIG. 5 is a plan view showing the construction of the vertical transfer electrode of the two-dimensional image sensor of FIG. 1 and a prior art.
Figure 6:
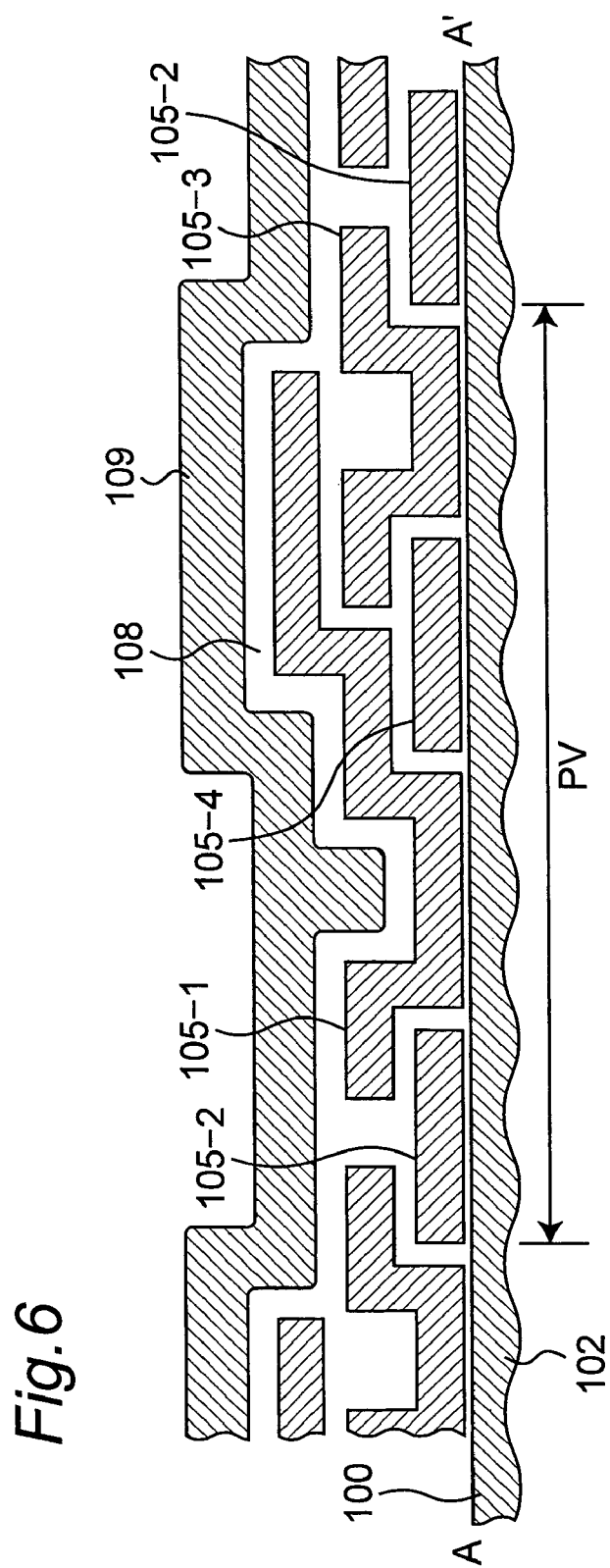
FIG. 6 is a sectional view taken along the line A–A' in FIG. 5.
Figure 7:
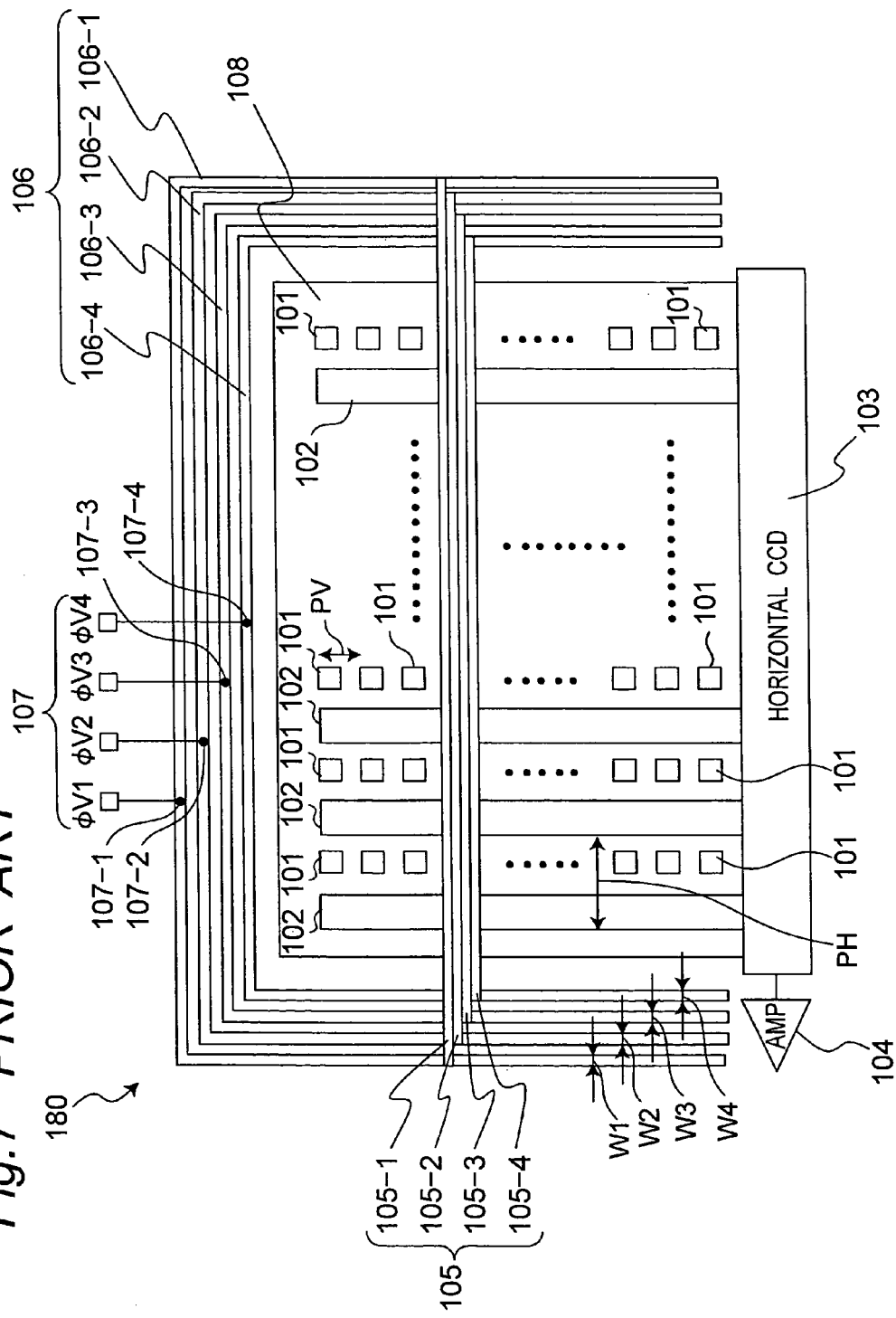
FIG. 7 is a plan view showing the schematic construction of a prior art two-dimensional image sensor.
Figure 8:
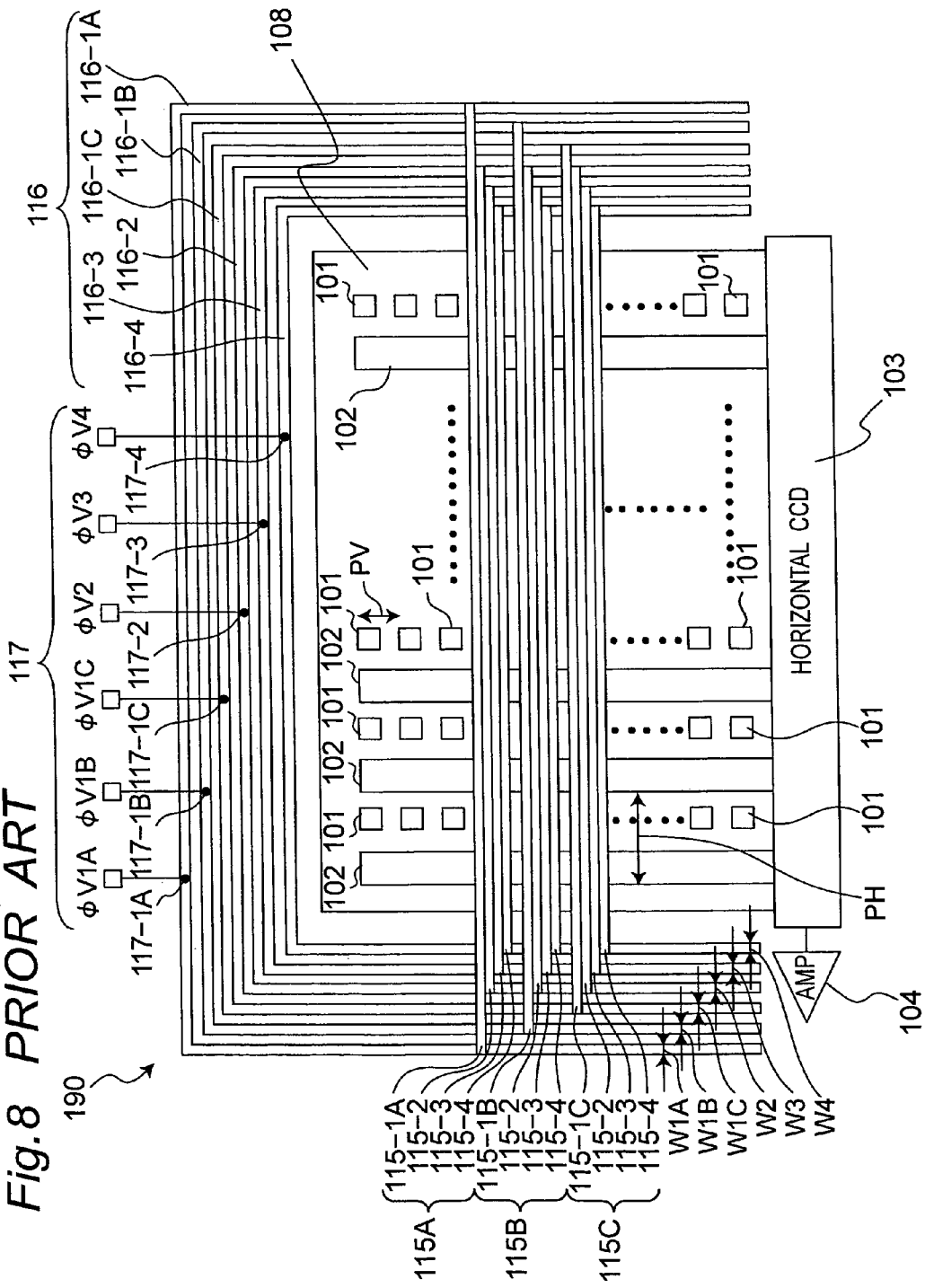
FIG. 8 is a plan view showing the schematic construction of another prior art two-dimensional image sensor.
Figure 9A:
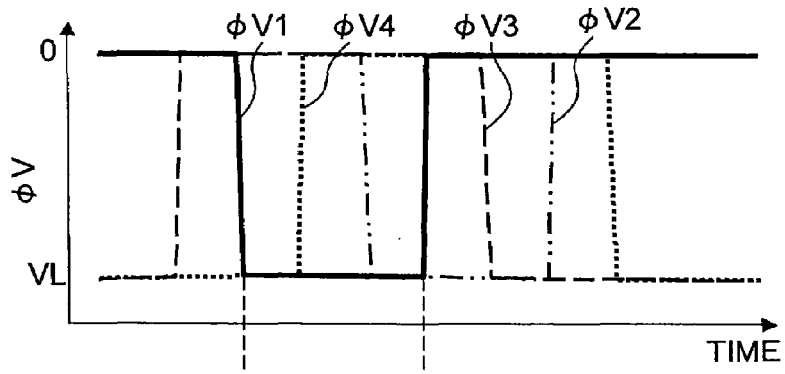
FIG. 9A is a view showing a clock pulse waveform at the vertical transfer signal input terminal of the two-dimensional image sensor of FIG. 7.
Figure 9B:
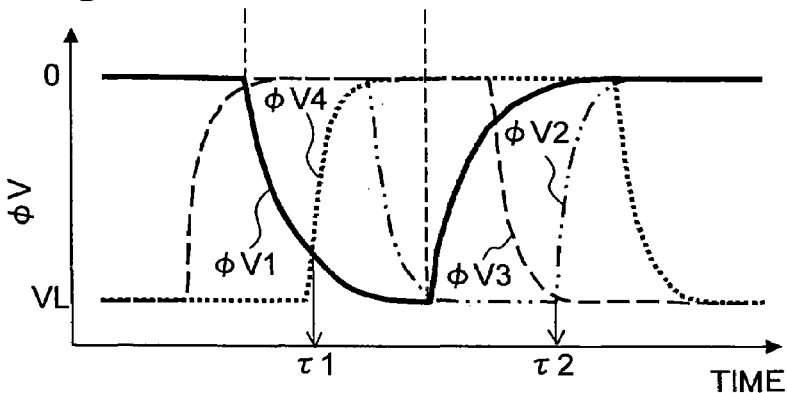
FIG. 9B is a view showing a clock pulse waveform at the vertical transfer electrode in a center portion of the imaging area of the two-dimensional image sensor of FIG. 7.
Figure 10A:
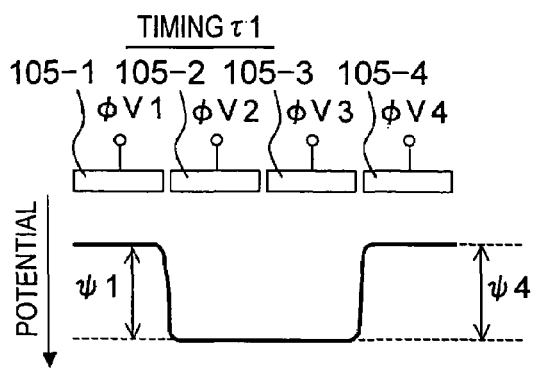
FIGS. 10A and 10B are views showing potentials right under the vertical transfer electrodes at timings $\tau 1$ and $\tau 2$, respectively, in FIG. 9B.
Figure 10B:
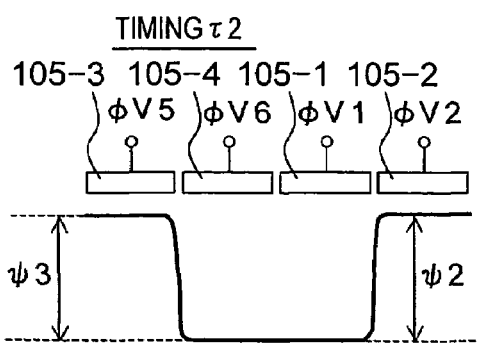

The plan layout and the cross-sectional structure of the vertical transfer electrodes 5-1, 5-2, and 5-3 and 5-4 are the same as those shown in FIGS. 5 and 6. That is, the surface area and the overlap area with other electrodes of the vertical transfer electrode 5-1 to which the clock pulse $\phi V1$ of the first phase is applied are larger than those of the vertical transfer electrodes 5-2, 5-3 and 5-4 of the other phases. In accordance with the above, the load capacity of the vertical transfer electrode 5-1 is larger than the load capacity of each of the other vertical transfer electrodes 5-2, 5-3 and 5-4.

In the present example, the vertical transfer electrodes 5-1, 5-2, 5-3 and 5-4 have a clip width set to 0.5 μm to 1 μm, a sheet resistance set to 10 Ω/□ to 100 Ω/□ and a thickness set to about 0.3 μm.

Moreover, as shown in FIG. 1, a group 6 of vertical transfer signal lines 6-1, 6-2, 6-3 and 6-4 is provided along three sides of the periphery of the imaging area 8. Vertical transfer signal input terminals 7-1, 7-2, 7-3 and 7-4, to which four-phase clock pulses $\phi V1$, $\phi V2$, $\phi V3$ and $\phi V4$ are inputted, are provided in portions along the upper side of the imaging area of the vertical transfer signal lines 6-1, 6-2, 6-3 and 6-4, respectively. The vertical transfer signal lines 6-1, 6-2, 6-3 and 6-4 connect the vertical transfer signal input terminals, to which the clock pulses $\phi V1$, $\phi V2$, $\phi V3$ and $\phi V4$ are inputted, with the end portions (located at the right and left of the imaging area 8) of the vertical transfer electrodes, to which the clock pulses are applied, in every phase of the clock pulse.

Among the vertical transfer signal lines 6-1, 6-2, 6-3 and 6-4, the width W1 of the vertical transfer signal line 6-1 connected to the vertical transfer electrode 5-1 having a large surface area on the vertical CCD's 2 is set wider than each of the widths W2, W3, and W4 of the vertical transfer signal lines 6-2, 6-3 and 6-4 connected to the other vertical transfer electrodes 5-2, 5-3 and 5-4. The widths W2, W3, and W4 of the vertical transfer signal lines 6-2, 6-3 and 6-4 connected to the vertical transfer electrodes 5-2, 5-3 and 5-4 are set mutually identical. That is, W1>W2=W3=W4.

In the pattern design stage of the vertical transfer signal lines, a design reference value (Ref.) is set to about 10 μm, based on which W1 is set to a value several times the design reference value (Ref.) and W2, W3 and W4 are each set to, for example, a value of about a half of the design reference value (Ref.). The change in the width of the vertical transfer signal lines is easily achieved by changing a mask pattern for forming the vertical transfer signal lines in the manufacturing stage of the two-dimensional image sensor 80.

The vertical transfer signal lines 6-1, 6-2, 6-3 and 6-4 are constituted of a mutually identical metal material (Al in the present example) and set to same thickness (about 50 nm in the present example) and have same sheet resistance (10 mΩ/□ to 100 mΩ/□ in the present example). It is noted that the vertical transfer signal lines have a portion (not shown) constituted of polysilicon to form a wiring portion for jumping other wiring lines, a protective resistance or the like.

In operation, the light-receiving portions 1 convert incident light into signal charges. The four-phase clock pulses φV1, φV2, φV3 and φV4 are applied to the vertical transfer signal input terminals 7-1, 7-2, 7-3 and 7-4 by an external circuit (not shown). The clock pulses φV1, φV2, φV3 and φV4 of the phases are transmitted to the end portions of the corresponding vertical transfer electrodes 5-1, 5-2, 5-3 and 5-4 from the corresponding vertical transfer signal input terminals 7-1, 7-2, 7-3 and 7-4, respectively, through the vertical transfer signal lines 6-1, 6-2, 6-3 and 6-4 connected to the input terminals. As a result, the signal charges generated by the light-receiving portions 1 are transferred in the vertical direction toward the horizontal CCD 3 through the vertical CCD's 2 adjacent to the light-receiving portions 1. The transferred signal charges are further transferred in the horizontal direction through the horizontal CCD 3 toward the amplifier 104, amplified by the amplifier 4 and then outputted.

As already described, the surface area and the overlap area with other electrodes of the vertical transfer electrode 5-1 to which the clock pulse φV1 of the first phase is applied are larger than those of the vertical transfer electrodes 5-2, 5-3 and 5-4 of the other phases. In accordance with the above, the load capacity of the vertical transfer electrode 5-1 is larger than the load capacity of each of the other vertical transfer electrodes 5-2, 5-3 and 5-4. However, among the vertical transfer signal lines 6-1, 6-2, 6-3 and 6-4, the width W1 of the vertical transfer signal line 6-1 connected to the vertical transfer electrode 5-1 having a large surface area on the vertical CCD's 2 is set wider than each of widths W2, W3, and W4 of the vertical transfer signal lines 6-2, 6-3 and 6-4 connected to the other vertical transfer electrodes 5-2, 5-3 and 5-4. Therefore, the electrical resistance of the vertical transfer signal line 6-1 is smaller than the electrical resistance of each of the vertical transfer signal lines 6-2, 6-3 and 6-4. As a result, the time constant of the signal propagation system (including the vertical transfer signal input terminal to the vertical transfer electrode) of the clock pulse φV1 of the first phase is made approximately equivalent to the time constant of each of the signal propagation systems of the clock pulses φV2, φV3 and φV4 of the other phases. Therefore, the waveform blunting of the transfer signal relevant to the vertical transfer signal line 6-1 is reduced.

Figure 2A:
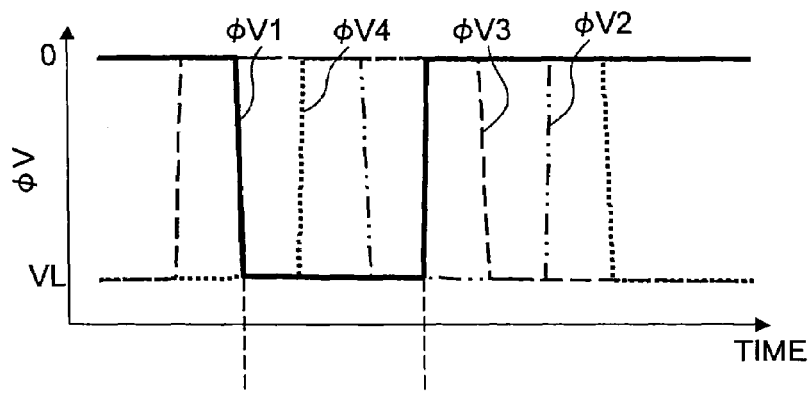
FIG. 2A is a graph showing a clock pulse waveform at the vertical transfer signal input terminal of the two-dimensional image sensor of FIG. 1.

For example, it is assumed that the clock pulses φV1, φV2, φV3 and φV4 are inputted in roughly rectangular waveforms to the vertical transfer signal input terminals 7-1, 7-2, 7-3 and 7-4, respectively, as shown in FIG. 2A. At this time, the waveform blunting of the clock pulse φV1 of the first phase becomes equivalent to the waveform blunting of the clock pulses φV2, φV3 and φV4 of the other phases in the center portion of the imaging area 8 as shown in FIG. 2B.

Figure 2B:
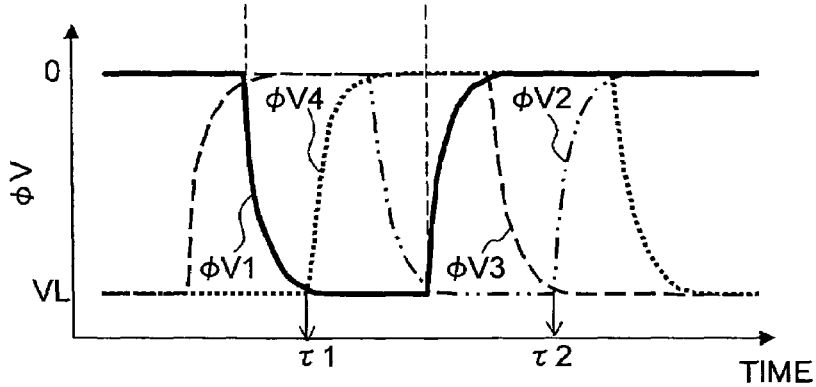
FIG. 2B is a view showing a clock pulse waveform at the vertical transfer electrode in a center portion of the imaging area of the two-dimensional image sensor of FIG. 1.
Figure 3A:
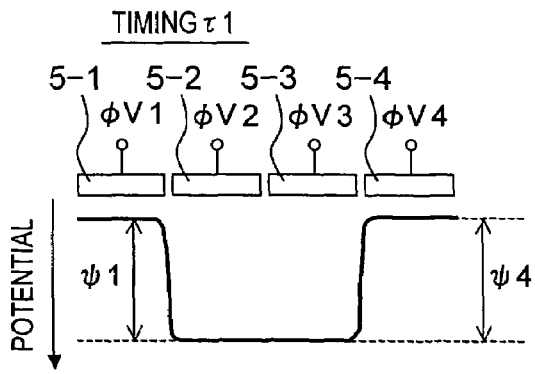
FIGS. 3A and 3B are charts showing potentials right under the vertical transfer electrodes at timings $\tau 1$ and $\tau 2$, respectively, in FIG. 2B.
Figure 3B:
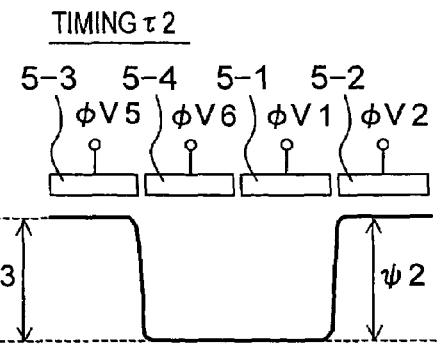

In concrete, the clock pulse φV4 starts to rise after the clock pulse φV1 sufficiently falls at the timing τ1 in FIG. 2B. Then, as shown in FIG. 3A, the potential barriers ψ1 and ψ4 that the vertical transfer electrodes 5-1 and 5-4 make in the vertical CCD's 2 become equivalent to the potential barriers ψ2 and ψ3 that the remaining vertical transfer electrodes 5-2 and 5-3 shown in FIG. 3B make. As a result, the handling amount of charge of the vertical CCD's 2 is not reduced due to the signal propagation system of the clock pulse φV1 of the first phase, and the handling amount of charge of the vertical CCD's 2 is sufficiently secured.

In this case, the line width of only the vertical transfer signal line 6-1 connected to the vertical transfer electrode 5-1 is widened, and therefore, the increase in the chip area can be suppressed to a minimum. That is, the handling amount of charge of the vertical CCD's 2 can be secured while suppressing an increase in the chip area. Moreover, it is acceptable to set the width of the vertical transfer signal lines 6-2, 6-3 and 6-4 connected to the other vertical transfer electrodes 5-2, 5-3 and 5-4 narrower than in the conventional case so long as a sufficiently large handling amount of charge is secured. When the above arrangement is adopted, the occupation area of the vertical transfer signal lines 6-2, 6-3 and 6-4 on the semiconductor substrate can be reduced, and the chip area can be reduced.

It is acceptable to substantially expand the line width by expanding the line width of polysilicon (not shown) for jumping lines or expanding the line width of protective resistance (not shown) in addition to the expansion of the line width of the metal that constitutes the vertical transfer signal line 6-1 as described above.

Moreover, in order to reduce the electrical resistance of the vertical transfer signal line 6-1 connected to the vertical transfer electrode 5-1, it is acceptable to set the sheet resistance small instead of expanding the line width. That is, the sheet resistance of the vertical transfer signal line 6-1 connected to the vertical transfer electrode 5-1 is set smaller than the sheet resistance of each of the vertical transfer signal lines 6-2, 6-3 and 6-4 connected to the other vertical transfer electrodes 5-2, 5-3 and 5-4. Also, in this case, the handling amount of charge of the vertical CCD's 2 is not reduced due to the signal propagation system of the clock pulse φV1 of the first phase, and the handling amount of charge of the vertical CCD's 2 is sufficiently secured. Moreover, the change in the sheet resistance of the vertical transfer signal lines is easily achieved by changing, for example, the material for forming the vertical transfer signal lines in the manufacturing stage of the two-dimensional image sensor 80. Moreover, no increase in the chip area occurs.

Moreover, in order to reduce the electrical resistance of the vertical transfer signal line 6-1 connected to the vertical transfer electrode 5-1, it is acceptable to set the thickness thick instead of expanding the line width. That is, the thickness of the vertical transfer signal line 6-1 connected to the vertical transfer electrode 5-1 is set thicker than the thickness of the vertical transfer signal lines 6-2, 6-3 and 6-4 connected to the other vertical transfer electrodes 5-2, 5-3 and 5-4. Also, in this case, the handling amount of charge of the vertical CCD's 2 is not reduced due to the signal propagation system of the clock pulse φV1 of the first phase, and the handling amount of charge of the vertical CCD's 2 is sufficiently secured. Moreover, the change in the thickness of the vertical transfer signal lines is easily achieved by changing, for example, the deposition time for forming the vertical transfer signal lines in the manufacturing stage of the two-dimensional image sensor 80. Moreover, no increase in the chip area occurs.

Although the load capacity of the vertical transfer electrode 5-1 to which the clock pulse φV1 of the first phase is applied is large among the vertical transfer electrodes 5-1, 5-2, 5-3 and 5-4 that constitute the groups according to the description of the present embodiment, the present invention is, of course, not limited to this. Even when the load capacity of any one of the vertical transfer electrodes 5-2, 5-3 and 5-4 to which the clock pulses φV2, φV3 and φV4 of the other phases are applied is large, the present invention is applicable by reducing the electrical resistance of the vertical transfer signal line corresponding to it. Moreover, also when the load capacities of plural vertical transfer electrodes are large as in, for example, the vertical transfer electrodes 5-1 and 5-3 to which the clock pulses φV1 and φV3 are applied, the present invention is applicable by reducing the electrical resistances of the vertical transfer signal lines corresponding to them.

Moreover, when three or more vertical transfer electrodes of different load capacities exist as in the case where the vertical transfer electrodes 5-1, 5-2, 5-3 and 5-4 that constitute a group on the vertical CCD's 2 have mutually varied surface area sizes, it is desirable to set the magnitude order of the electrical resistances of the vertical transfer signal lines reverse to the size order of the surface areas of the vertical transfer electrodes on the vertical CCD's 2. With the above arrangement, the reduction in the handling amount of charge caused by the waveform blunting of the clock pulses applied to the vertical transfer electrodes can be more effectively suppressed, and a sufficiently large handling amount of charge can be secured.

Although the present embodiment has been described on the basis of the four-phase drive, it is, of course, possible to apply the present invention to three-phase drive, six-phase drive and so on other than the four-phase drive.

(Second Embodiment)

Figure 4:
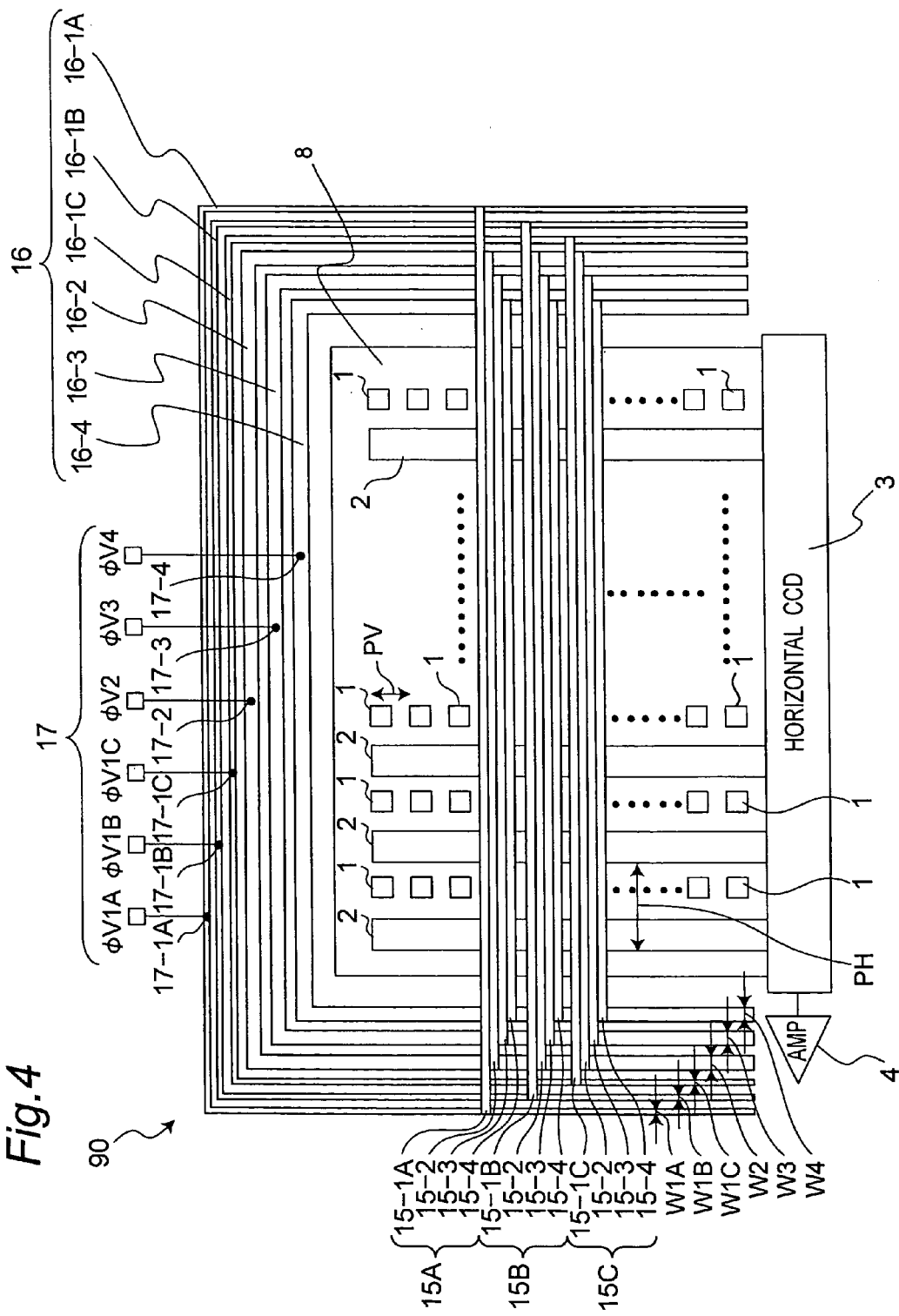
FIG. 4 is a plan view showing the schematic construction of a two-dimensional image sensor according to a second embodiment of the present invention.

FIG. 4 shows the construction of a CCD type two-dimensional image sensor 90 that is able to perform thinning read of another embodiment. In FIG. 4, the same constituents as the constituents of FIG. 1 are denoted by the same reference numerals, and no description is provided for the individual ones.

The two-dimensional image sensor 90 has a group 15A of four-phase vertical transfer electrodes 15-1A, 15-2, 15-3 and 15-4, a group 15-1B of four-phase vertical transfer electrodes 15-1B, 15-2, 15-3 and 15-4 and a group 15-1C of four-phase vertical transfer electrodes 15-1C, 15-2, 15-3 and 15-4, which are constituted of polysilicon doped with an impurity, are provided horizontally across the imaging area 8. Although three groups are shown in the figure for simplicity, numbers of groups identical to the three groups 15A, 15B and 15C are provided in a repetitive pattern in the vertical direction.

The clock pulse φV1 of the first phase is divided into three clock pulses φV1A, φV1B and φV1C that are mutually independently selected and inputted. In accordance with the above, three vertical transfer signal input terminals 17A-1, 17B-1 and 17C-1 and three vertical transfer signal lines 16A-1, 16B-1 and 16C-1 as sub-transfer signal lines are provided. The three vertical transfer signal lines 16A-1, 16B-1 and 16C-1 are distributed to the plural groups 15A, 15B and 15C of the transfer electrodes arranged in the vertical direction and connected to the transfer electrodes 15-1A, 15-1B and 15-1C, respectively, to which the clock pulses φV1A, φV1B and φV1C of the first phase are sequentially applied. The other vertical transfer signal input terminals 17-2, 17-3 and 17-4 and the vertical transfer signal lines 16-2, 16-3 and 16-4 are the same as the vertical transfer signal input terminals 7-2, 7-3 and 7-4 and the vertical transfer signal lines 6-2, 6-3 and 6-4, respectively, in FIG. 1.

Since the clock pulses φV1A, φV1B and φV1C are obtained by dividing the original clock pulse φV1 in order to perform the thinning read, the sum total of the number of the vertical transfer electrodes to which the clock pulses φV1A, φV1B and φV1C are applied and the number of the vertical transfer electrodes to which, for example, another clock pulses φV2 is applied are the same. Moreover, the number of the vertical transfer electrodes to which the clock pulse φV2 is applied, the number of the electrodes to which the clock pulse φV3 is applied and the number of the electrodes to which the clock pulse φV4 is applied are the same. That is, the number of the vertical transfer electrodes to which the individual clock pulses of the first phase (e.g., φV1A) are applied is extremely smaller than the number of the vertical transfer electrodes to which the clock pulses φV2, φV3 and φV4 of the other phases are applied.

Among the vertical transfer signal lines 16A-1, 16B-1, 16C-1, 16-2, 16-3 and 16-4, the widths W1A, W1B and W1C of the vertical transfer signal lines 16A-1, 16B-1 and 16C-1 of the first phase are equal to one another and set narrower than the widths W2, W3 and W4 of the vertical transfer signal lines 16-2, 16-3, and 16-4 of the other phases. The widths W2, W3 and W4 of the vertical transfer signal lines 16-2, 16-3, and 16-4 are set equal to one another. That is, W1A=W1B=W1C>W2=W3=W4.

The change in the width of the vertical transfer signal lines is easily achieved by changing a mask pattern for forming the vertical transfer signal lines in the manufacturing stage of the two-dimensional image sensor 90.

The vertical transfer signal lines 16A-1, 16B-1, 16C-1, 16-2, 16-3 and 16-4 are constituted of a mutually identical metal material (Al in the present example) and set to same thickness (about 50 nm in the present example) and have same sheet resistance (10 mΩ/□ to 100 mΩ/□ in the present example). It is noted that the vertical transfer signal lines have a portion (not shown) constituted of polysilicon to form a wiring portion for jumping other wiring lines, a protective resistance or the like.

The basic operation of the two-dimensional image sensor 90 is the same as that of the one of FIG. 1. When the signal charges generated by the light-receiving portions 1 are read to the vertical CCD's 2, it is possible to select between a manner such that the inputted clock pulses φV1A, φV1B and φV1C of the first phase do not simultaneously go High level but alternately go High level, a manner such that a certain clock pulse does not go High level and another manner, in order to perform the thinning read. When the signal charges are transferred through the vertical CCD's 2, all the clock pulses φV1A, φV1B and φV1C go High level or Low level at the same timing as φV1 and operate as the four-phase clock pulses φV1, φV2, φV3 and φV4.

In the two-dimensional image sensor 90, the number of the vertical transfer electrodes connected to the vertical transfer signal lines 16A-1, 16B-1 and 16C-1 of the first phase is smaller than the number of the vertical transfer electrodes connected to the vertical transfer signal lines 16-2, 16-3 and 16-4 of the other phases. As a result, the load capacity connected to the vertical transfer signal lines 16A-1, 16B-1 and 16C-1 of the first phase is smaller than the load capacity connected to the vertical transfer signal lines 16-2, 16-3 and 16-4 of the other phases. Accordingly, there is a margin to increase the electrical resistance of the vertical transfer signal lines 16A-1, 16B-1 and 16C-1 of the first phase greater than the electrical resistance of the vertical transfer signal lines 16-2, 16-3 and 16-4 of the other phases from the viewpoint that the time constants of the signal propagation systems of the phases are equalized. As in the present example, even when the widths W1A, W1B and W1C of the vertical transfer signal lines 16A-1, 16B-1 and 16C-1 of the first phase are set narrower than the widths W2, W3 and W4 of the vertical transfer signal lines 16-2, 16-3 and 16-4 of the other phases, the problem of the reduction in the handling amount of charge caused by the signal propagation systems of the clock pulses φV1A, φV1B and φV1C of the first phase does not occur.

Moreover, in the two-dimensional image sensor 90, since the widths W1A, W1B and W1C of the vertical transfer signal lines 16A-1, 16B-1 and 16C-1 of the first phase are set narrow, the occupation area of the vertical transfer signal lines on the semiconductor substrate can be reduced. With this arrangement, the chip area can be reduced, and the chip cost can be reduced.

It is noted that the widths W1A, W1B and W1C of the vertical transfer signal lines 16A-1, 16B-1 and 16C-1, to which the clock pulses φV1A, φV1B and φV1C of the first phase are inputted, are not always required to be proportional to the number (or the load capacity) of the vertical transfer electrodes connected to the vertical transfer signal lines 16A-1, 16B-1 and 16C-1. However, by setting the magnitude order of the widths of the vertical transfer signal lines according to the magnitude order of the load capacities, the ratio of the occupation area of the vertical transfer signal lines relative to the imaging area 8 can be appropriately reduced. With this arrangement, the chip area can be reduced while securing a sufficiently large handling amount of charge.

Recently, in accordance with the improvement in the performance of the CCD type solid-state imaging device, the number of inputs of the clock pulses tends to increase. Since neither the area of the imaging area 8 nor the total capacity of the vertical transfer electrodes change, the average load capacity connected to each vertical transfer signal line is to be reduced according to it when the number of inputs of the clock pulses is increased. At this time, it is sometimes the case where a large difference might occur among the load capacities connected to the vertical transfer signal lines. With regard to the vertical transfer signal line having a small load capacity, the occupation area of the wiring lines can be reduced and the chip area can be reduced by positively reducing the line width.

It is acceptable to substantially reduce the line width by reducing the line width of polysilicon (not shown) for jumping lines or reducing the line width of protective resistance (not shown) in addition to the reduction of the line width of the metal that constitutes the vertical transfer signal lines 16A-1, 16B-1 and 16C-1 as described above.

Although only the clock pulse φV1 of the first phase is divided into the three clock pulses φV1A, φV1B and φV1C in the present embodiment, the present invention is, of course, not limited to this. The present invention can also be applied to a case where, for example, the clock pulse φV1 of the first phase is divided into two clock pulses φV1A and φV1B that are mutually independently selected and inputted, and the clock pulse φV3 of the third phase is divided into two clock pulses φV3A and φV3B that are mutually independently selected and inputted, i.e., a case where the clock pulses of two or more phases are divided.

Moreover, when a structure of, for example, a FIT (Frame Interline Transfer) structure, a structure of pixel addition and pixel thinning in the horizontal detection or the like is added for use other than the purpose of driving the vertical CCD's 2 in the imaging area 8 for the improvement in the performance of the solid-state imaging device, it is sometimes the case where another clock pulse input, a wiring line and an electrode might newly become needed. When the needed another clock pulse input is added and when the load capacity of the wiring line to which the added clock pulse is applied is small, the present invention can be similarly applicable by reducing the line width of the added wiring line.

Although the present embodiment has been described on the basis of the four-phase drive, it is, of course, possible to apply the present invention to three-phase drive, six-phase drive and so on other than the four-phase drive.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A solid-state imaging device comprising:
   a light-receiving portion, which is provided in an imaging area set on a surface of a semiconductor substrate and converts incident light into a signal charge;
   at least one transfer channel extending in one direction in the imaging area;
   a group of transfer electrodes, which extend in a direction crossing the transfer channels on the imaging area and to which transfer signals of plural phases are applied so as to transfer the signal charge through the transfer channel; and
   a group of transfer signal lines, which are provided along a periphery of the imaging area on the semiconductor substrate and connect an input terminal to which a transfer signal is inputted with an end portion of the transfer electrode to which the transfer signal is to be applied, in every transfer signal of each phase, wherein
   a transfer signal line connected to a transfer electrode having a large surface area on the transfer channel in the group of the transfer electrodes, of the transfer signal lines that constitute the group, has an electrical resistance smaller than that of a transfer signal line connected to a transfer electrode having a small surface area on the transfer channel in the group of the transfer electrodes.

2. The solid-state imaging device as claimed in claim 1, wherein
   the number of the transfer electrodes that constitute the group is three or more, and a magnitude order of electrical resistances of the transfer signal lines that constitute the group is reverse to a size order of the surface areas on the transfer channel of the transfer electrodes to which the transfer signal lines are connected.

3. The solid-state imaging device as claimed in claim 1, wherein
   the transfer signal line connected to the transfer electrode having a large surface area on the transfer channel, of the transfer signal lines that constitute the group, has a width set wider than that of the transfer signal line connected to the transfer electrode having a small surface area on the transfer channel.

4. The solid-state imaging device as claimed in claim 1, wherein
   the transfer signal line connected to the transfer electrode having a large surface area on the transfer channel, of the transfer signal lines that constitute the group, has a sheet resistance set smaller than that of the transfer signal line connected to the transfer electrode having a small surface area on the transfer channel.

5. The solid-state imaging device as claimed in claim 1, wherein
the transfer signal line connected to the transfer electrode having a large surface area on the transfer channel, of the transfer signal lines that constitute the group, has a thickness set thicker than that of the transfer signal line connected to the transfer electrode having a small surface area on the transfer channel.

6. The solid-state imaging device as claimed in claim 1, wherein
a transfer signal line connected to a transfer electrode having a large load capacity in the group of the transfer electrodes, of the transfer signal lines that constitute the group, has an electrical resistance smaller than that of a transfer signal line connected to a transfer electrode having a small load capacity in the group of the transfer electrodes.

7. The solid-state imaging device as claimed in claim 1, wherein
a transfer signal line connected to a transfer electrode having a large time constant in the group of the transfer electrodes, of the transfer signal lines that constitute the group, has an electrical resistance smaller than that of a transfer signal line connected to a transfer electrode having a small time constant in the group of the transfer electrodes.

8. The solid-state imaging device as claimed in claim 1, wherein
a transfer signal of a specified phase of the transfer signals of the plural phases is divided into plural sub-transfer signals that are mutually independently selected and inputted,
an input terminal and a transfer signal line, which transmit the transfer signal of the specified phase, are respectively divided into sub-input terminals and sub-transfer signal lines of a number identical to a number of the sub-transfer signals,
the plural sub-transfer signal lines, which transmit the transfer signal of the specified phase, are distributed to plural groups of transfer electrodes arranged in the one direction and connected to corresponding transfer electrodes of each group, and
the sub-transfer signal line, which transmits the transfer signal of the specified phase, has a width set narrower than that of the transfer signal line that transmits a transfer signal of another phase.

9. A solid-state imaging device comprising:
a light-receiving portion, which is provided in an imaging area set on a surface of a semiconductor substrate and converts incident light into a signal charge;
at least one transfer channel extending in one direction in the imaging area;
a group of transfer electrodes, which extend in a direction crossing the transfer channels on the imaging area and to which transfer signals of plural phases are applied so as to transfer the signal charge through the transfer channel; and
a group of transfer signal lines, which are provided along a periphery of the imaging area on the semiconductor substrate and connect an input terminal to which a transfer signal is inputted with an end portion of the transfer electrode to which the transfer signal is to be applied, in every transfer signal of each phase, wherein
a transfer signal line connected to a transfer electrode having a large load capacity in the group of the transfer electrodes, of the transfer signal lines that constitute the group, has an electrical resistance smaller than that of a transfer signal line connected to a transfer electrode having a small load capacity in the group of the transfer electrodes.

10. A solid-state imaging device comprising:
a light-receiving portion, which is provided in an imaging area set on a surface of a semiconductor substrate and converts incident light into a signal charge;
at least one transfer channel extending in one direction in the imaging area;
a group of transfer electrodes, which extend in a direction crossing the transfer channels on the imaging area and to which transfer signals of plural phases are applied so as to transfer the signal charge through the transfer channel; and
a group of transfer signal lines, which are provided along a periphery of the imaging area on the semiconductor substrate and connect an input terminal to which a transfer signal is inputted with an end portion of the transfer electrode to which the transfer signal is to be applied, in every transfer signal of each phase, wherein
a transfer signal line connected to a transfer electrode having a large time constant in the group of the transfer electrodes, of the transfer signal lines that constitute the group, has an electrical resistance smaller than that of a transfer signal line connected to a transfer electrode having a small time constant in the group of the transfer electrodes.

* * * * *